United States Patent
Sumi et al.

(10) Patent No.: US 9,655,172 B2
(45) Date of Patent: May 16, 2017

(54) TOUCH SLIDER UNIT AND MICROWAVE OVEN HAVING TOUCH SLIDER UNIT

(71) Applicant: Panasonic Intellectual Property Management Co., Ltd., Osaka-shi, Osaka (JP)

(72) Inventors: Hiroshi Sumi, Shiga (JP); Haruka Ohno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/405,332

(22) PCT Filed: Jun. 4, 2013

(86) PCT No.: PCT/JP2013/003511
§ 371 (c)(1),
(2) Date: Dec. 3, 2014

(87) PCT Pub. No.: WO2013/183286
PCT Pub. Date: Dec. 12, 2013

(65) Prior Publication Data
US 2015/0130752 A1  May 14, 2015

(30) Foreign Application Priority Data

Jun. 4, 2012  (JP) .................................. 2012-126767

(51) Int. Cl.
*H05B 6/64* (2006.01)
*G06F 3/03* (2006.01)
(Continued)

(52) U.S. Cl.
CPC ......... *H05B 6/6435* (2013.01); *G06F 3/0304* (2013.01); *G06F 3/0338* (2013.01);
(Continued)

(58) Field of Classification Search
CPC . H05B 6/6435–6/6441; G06F 3/0304–3/0312; G06F 3/033;
(Continued)

(56) References Cited

U.S. PATENT DOCUMENTS

2005/0012709 A1* 1/2005 Ohshima ................. G02F 1/167
345/107
2007/0144874 A1* 6/2007 Dorwarth ............ G06F 3/04883
200/5 A (Continued)

FOREIGN PATENT DOCUMENTS

CN 101458584 A 6/2009
CN 101536611 A 9/2009
(Continued)

OTHER PUBLICATIONS

Office Action, and English translation thereof, in corresponding Chinese Application No. 201380029299.7 dated Dec. 31, 2015, 11 pages.

(Continued)

*Primary Examiner* — Nathan Danielsen
(74) *Attorney, Agent, or Firm* — Brinks Gilson & Lione (57) ABSTRACT

A touch slider unit includes: a touch slider having a contact part to be in contact with a user and a light-transmitting part disposed to surround a circumference of the contact part; an electrode disposed on a back surface of the contact part of the touch slider; a controller which detects a change in electrostatic capacity of the electrode to detect a contact of the user with the touch slider based on the detected change in the electrostatic capacity of the electrode; and a light source disposed on the back side of the touch slider to emit a light, thereby having a favorable backlight characteristic and an improved operability.

9 Claims, 9 Drawing Sheets (51) Int. Cl.
  *G06F 3/041* (2006.01)
  *G06F 3/044* (2006.01)
  *G09G 3/34* (2006.01)
  *H03K 17/96* (2006.01)
  *G06F 3/0338* (2013.01)

(52) U.S. Cl.
  CPC ............ *G06F 3/044* (2013.01); *G06F 3/0416* (2013.01); *G09G 3/3406* (2013.01); *H03K 17/9622* (2013.01); *G06F 2203/04112* (2013.01); *H03K 2217/96066* (2013.01); *H03K 2217/96079* (2013.01); *H03K 2217/960785* (2013.01)

(58) Field of Classification Search
  CPC ...... G06F 3/0338; G06F 3/0416; G06F 3/044; G06F 2203/04108; G06F 2203/04111; G06F 2203/04112; G09G 3/34–3/342; H03K 17/962; H03K 17/9622; H03K 2217/96066; H03K 2217/960785–2217/960795
  See application file for complete search history.

(56) References Cited

U.S. PATENT DOCUMENTS

| | | | |
|---|---|---|---|
| 2007/0152977 A1* | 7/2007 | Ng | G06F 3/03547 345/173 |
| 2007/0289860 A1 | 12/2007 | Newman et al. | |
| 2008/0224900 A1 | 9/2008 | Konno et al. | |
| 2008/0278178 A1 | 11/2008 | Philipp | |
| 2009/0153517 A1 | 6/2009 | Liu et al. | |
| 2010/0193258 A1 | 8/2010 | Simmons et al. | |
| 2010/0200309 A1* | 8/2010 | Yilmaz | G06F 3/016 178/18.03 |
| 2011/0221509 A1* | 9/2011 | Bergamo | G06F 3/044 327/517 |
| 2011/0262631 A1 | 10/2011 | Lee et al. | |
| 2011/0299129 A1 | 12/2011 | Ishida et al. | |

FOREIGN PATENT DOCUMENTS

| | | |
|---|---|---|
| CN | 101681223 A | 3/2010 |
| CN | 101689089 A | 3/2010 |
| CN | 102236486 A | 11/2011 |
| JP | 2003-178657 A | 6/2003 |
| JP | 2008-226729 A | 9/2008 |
| JP | 2008-288188 A | 11/2008 |
| JP | 2010-244585 A | 10/2010 |
| JP | 2011-259163 A | 12/2011 |
| WO | WO 2005/019987 A2 | 3/2005 |
| WO | WO 2005/019987 A3 | 3/2005 |

OTHER PUBLICATIONS

International Preliminary Report on Patentability, and English language translation thereof, in corresponding International Application No. PCT/JP2013/003511, dated Dec. 18, 2014, 11 pages.

International Search Report, and English language translation thereof, in corresponding International Application No. PCT/JP2013/003511, dated Jul. 9, 2013, 4 pages.

* cited by examiner

TOUCH SLIDER UNIT AND MICROWAVE OVEN HAVING TOUCH SLIDER UNIT

This application is a 371 application of PCT/JP2013/003511 having an international filing date of Jun. 4, 2013, which claims priority to JP 2012-126767 filed Jun. 4, 2012, the entire contents of which are incorporated herein by reference.

TECHNICAL FIELD

The present invention relates to a touch slider unit and a microwave oven having a touch slider unit.

BACKGROUND ART

In an electrical product such as a microwave oven provided with a conventional rotary control, the rotary control is operated to set a cooking time (see, e.g., Patent Document 1).

PATENT DOCUMENT

Patent Document 1: JP 2008-288188
Patent Document 2: JP 2010-244585

SUMMARY OF THE INVENTION

Technical Problem

However, a microwave oven as described in Patent Document 1 is required to improve its operability.

For example, there is an audio player provided with a touch slider unit 120 (see, e.g., Patent Document 2).

Figure 12:
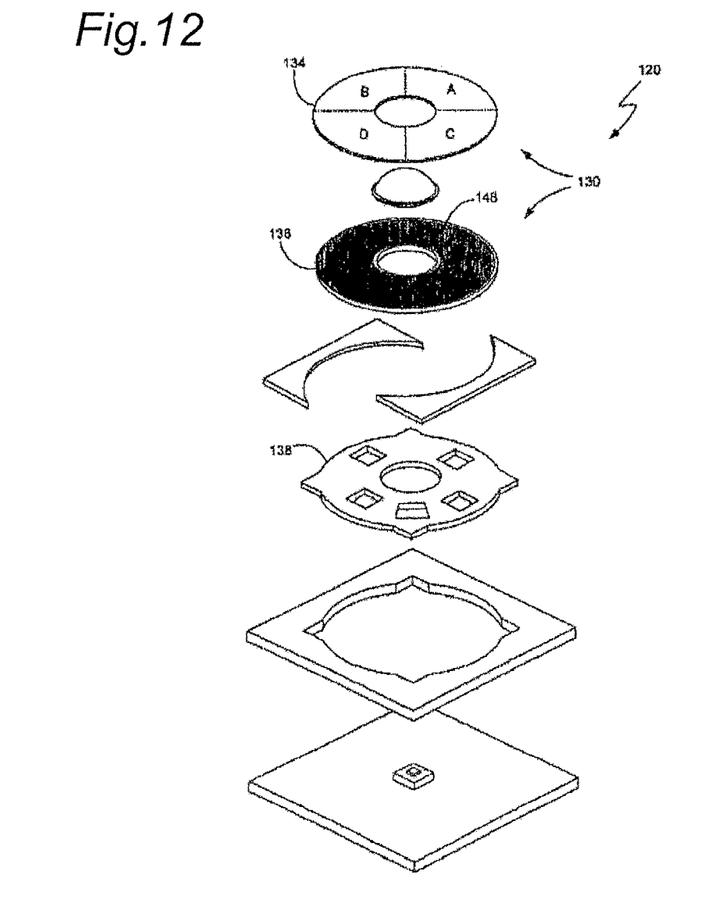
FIG. 12 is an exploded perspective view of an audio player including a conventional touch slider unit.

FIG. 12 depicts the touch slider unit 120 included in the audio player described in Patent Document 2. The touch slider unit 120 can be operated to select a song or adjust a sound volume of music in the audio player of Patent Document 2.

As depicted in FIG. 12, the touch slider unit 120 includes a circular touch pad assembly 130. The circular touch pad assembly 130 includes a decorative disk 134, a circuit board 136, and a reinforcing plate 138. An electrode layer 148 is disposed on the circuit board 136.

However, a configuration like the touch slider unit 120 described above is difficult to achieve a favorable backlight characteristic because the circuit board 136 and the electrode layer 148 in the touch slider unit 120 block a light.

Although a transparent electrode may be used, the transparent electrode is expensive and therefore causes a problem of increasing a production cost.

Therefore, it is an object of the present invention to solve the conventional problem and to provide a microwave oven including a touch slider unit having a favorable backlight characteristic and an improved operability.

Solution to Problem

To solve the conventional problem, a touch slider unit of the present invention includes a touch slider having a contact part to be in contact with a user and a light-transmitting part disposed to surround a circumference of the contact part, an electrode disposed on a back surface of the contact part of the touch slider, a controller which detects a change in electrostatic capacity of the electrode to detect a contact of the user with the touch slider based on the detected change in the electrostatic capacity of the electrode, and a light source disposed on the back side of the touch slider to emit a light.

This can achieve a favorable backlight characteristic and an improved operability.

Effects of the Invention

The touch slider unit of the present invention has a favorable backlight characteristic and an improved operability.

DETAILED DESCRIPTION OF THE PREFERRED EMBODIMENTS

A first invention is a touch slider unit including: a touch slider having a contact part to be in contact with a user and a light-transmitting part disposed to surround a circumference of the contact part; an electrode disposed on a back surface of the contact part of the touch slider; a controller which detects a change in electrostatic capacity of the electrode to detect a contact of the user with the touch slider based on the detected change in the electrostatic capacity of the electrode; and a light source disposed on the back side of the touch slider to emit a light. As a result, the light from the light source is emitted via the light-transmitting part of the touch slider to the outside and acts as a backlight of the touch slider unit. This can achieve a favorable backlight characteristic and an improved operability of the touch slider unit.

A second invention is the first invention, wherein the electrode is formed by printing a conductive material on a transparent sheet, and wherein an electrode wiring connected to the electrode and connected to the controller is formed on the sheet at a position facing the light-transmitting part of the touch slider. As a result, since the electrode wiring is formed on the transparent sheet, the light from the light source can be allowed to reach the light-transmitting part of the touch slider via the transparent sheet from between the electrode wirings even though the electrode wirings block the light. In this way, the favorable backlight characteristic of the light source can be maintained.

A third invention is the second invention, wherein a ground pattern is formed on the sheet to surround a circumference around the electrode and the electrode wiring. As a result, the formation of the ground pattern surrounding the circumference around the electrode and the electrode wiring enables a reduction in electric noise induced by the electrode of the touch slider due to a foreign electric wave noise. Therefore, the touch slider unit is hardly affected by the foreign noise and can show a stable performance.

A fourth invention is any one of the first invention to the third invention, wherein a light guide plate is provided between the light source and the touch slider to guide the light from the light source to the light-transmitting part of the touch slider. As a result, the light from the light source can be guided to the light-transmitting part of the touch slider because of an action of the light guide plate disposed between the light source and the touch slider, thereby emitting the light from the light-transmitting part more uniformly while reducing a diffusional decay of the light. Therefore, the backlight with favorable luminous efficiency and excellent uniformity can be achieved.

A fifth invention is the fourth invention, wherein the light guide plate has a first surface to reflect a light which entered the light guide plate from the light source, and a second surface to reflect a light reflected by the first surface toward the light-transmitting part. As a result, the light is reflected by the first and second surfaces included in the light guide plate, thereby achieving the favorable backlight characteristic without providing a reflection tape etc. in the light guide plate for reflecting the light, and thereby reducing the number of parts of the light guide plate.

A sixth invention is the fifth invention, wherein a matte finish is applied to the second surface of the light guide plate. As a result, the matte finish applied to the second surface enables diffusion of the light reflected by the second surface, thereby reducing unevenness of the light and improving the uniformity of the backlight.

A seventh invention is any one of the first invention to the sixth invention, wherein the controller is formed into a plate shape and disposed to face the back surface of the touch slider, and wherein the light source is disposed on the controller. As a result, space-saving can be achieved.

An eighth invention is the seventh invention, wherein the light source is disposed to face the contact part of the touch slider, wherein a plurality of additional light sources, each of which emits a light of a color different from the light source, are disposed on the controller at positions facing the light-transmitting part of the touch slider, and wherein when the controller detects a contact of a user with the touch slider, a light is emitted by the additional light source closest to the portion of the touch slider coming into contact with the user. As a result, when the additional light source is turned on, the user can intuitively understand that the contact with the touch slider is recognized by the touch slider unit. This enables further improvement in the operability of the touch slider unit.

A ninth invention is any one of the first invention to the eighth invention, wherein a surface on the light-transmitting part of the touch slider allowing passage of the light is a concave-convex surface. As a result, the surface allowing passage of the light on the light-transmitting part is formed as the concave-convex surface, thereby diffusing the light from the light-transmitting part. Therefore, the unevenness of the light can be reduced and the uniformity of the backlight can be improved. Additionally, components disposed on the back side of the light-transmitting part can be less conspicuous, thereby achieving a favorable design effect.

A tenth invention is any one of the first invention to the ninth invention, wherein a matte finish is applied to a surface on the light-transmitting part of the touch slider allowing passage of the light. As a result, the matte finish enables the diffusion of the light from the light-transmitting part, thereby improving the uniformity of the backlight.

An eleventh invention is a microwave oven including: the touch slider unit of any one of the first invention to the tenth invention. This can achieve the favorable backlight characteristic and the improved operability of the touch slider unit.

Hereinafter, embodiments of the present invention will be described with reference to drawings. These embodiments are not intended to limit the present invention.

Fifth Embodiment

Figure 1:
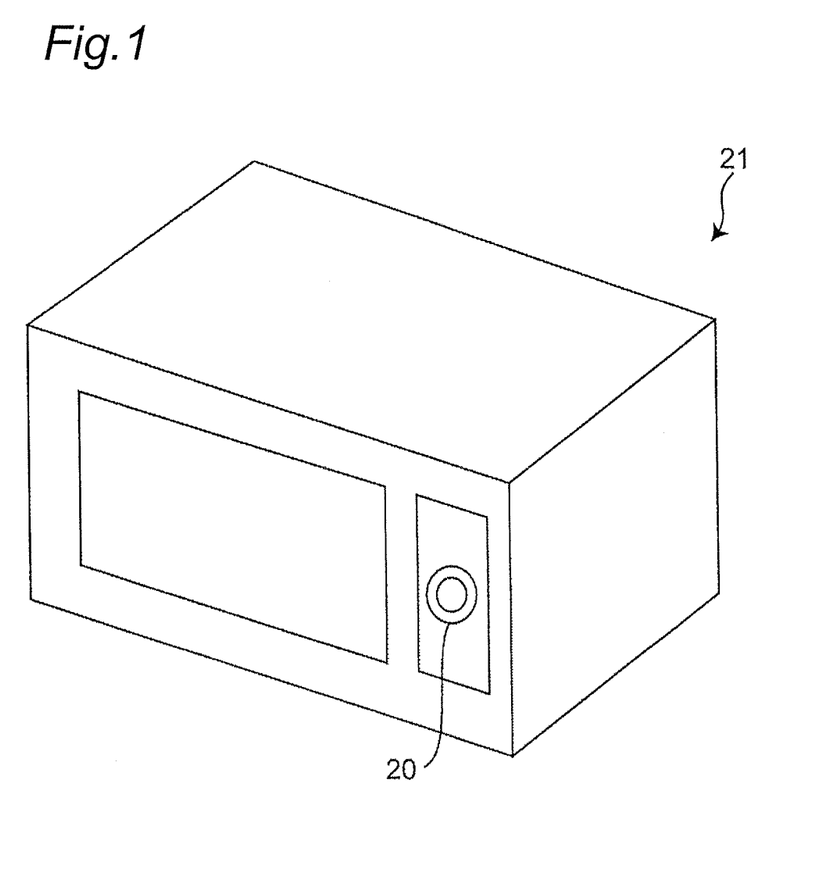
FIG. 1 is a perspective view of a microwave oven including a touch slider unit in a first embodiment of the present invention.

FIG. 1 is a perspective view of a microwave oven 21 including a touch slider unit 20 according to a first embodiment of the present invention. In the first embodiment, the touch slider unit 20 is disposed on a front surface of the microwave oven 21.

Figure 2:
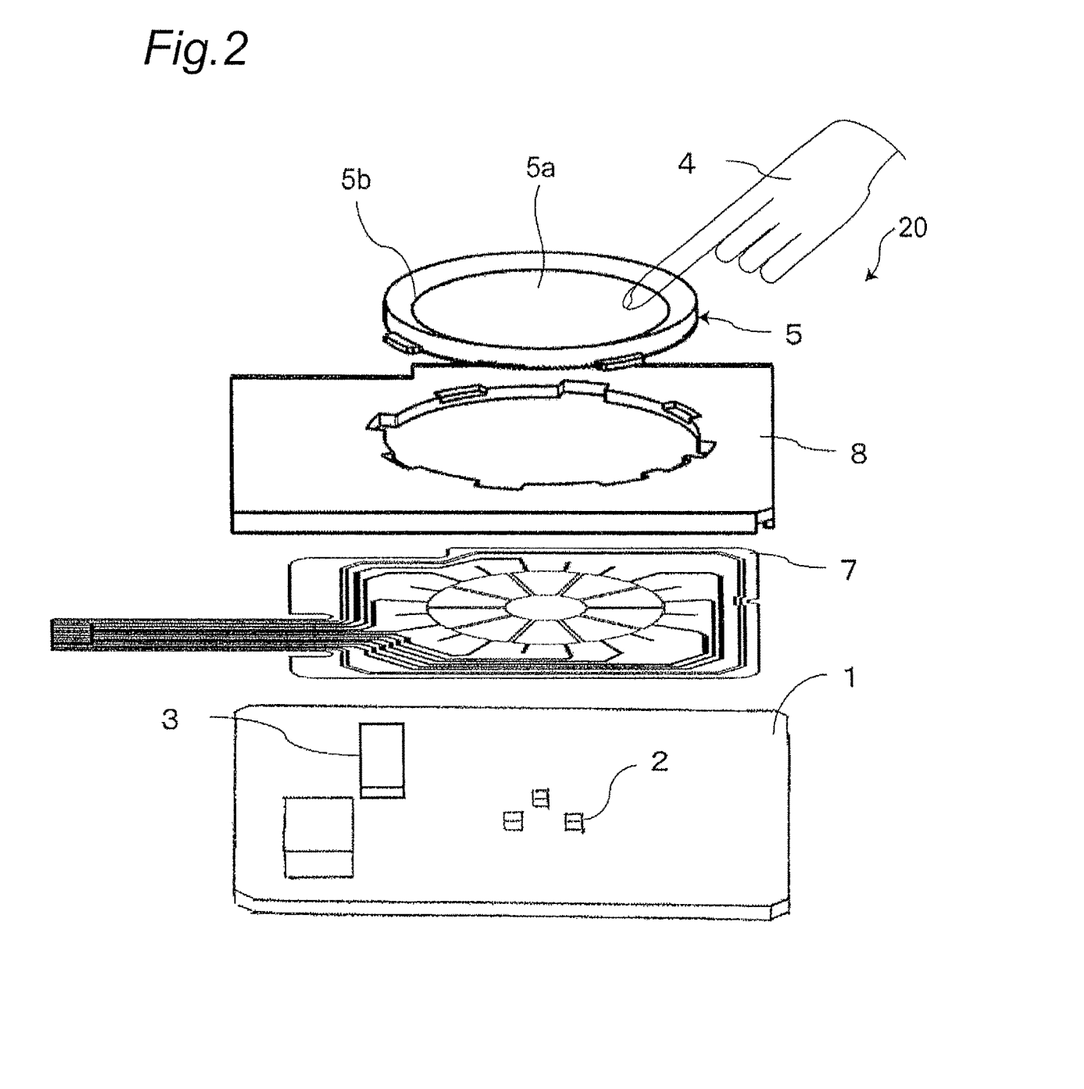
FIG. 2 is an exploded perspective view of the touch slider unit in the first embodiment of the present invention.

FIG. 2 is an exploded perspective view of the touch slider unit 20 depicted in FIG. 1.

As depicted in FIG. 2, the touch slider unit 20 includes a controller 1 having an IC 3, light sources 2, a touch slider 5, an electrode sheet 7, and a holder 8. The light sources 2 and the IC 3 are disposed on a surface of the controller 1 while the touch slider 5, the electrode sheet 7, and the holder 8 are disposed above the controller 1.

The controller 1 is a member holding the light sources 2 and the IC 3 and is formed into a plate shape in the first embodiment.

The light sources 2 are components to emit a light toward the touch slider 5 and the electrode sheet 7. By way of example, LEDs are employed as the light sources 2 in the first embodiment. The light sources 2 are disposed upright with respect to the controller 1 and emit the light such that luminance of the light becomes largest in a direction perpendicular to the controller 1.

The IC 3 included in the controller 1 is an integrated circuit for controlling a function of the touch slider 5. In this embodiment, the IC 3 also has a function of controlling ON/OFF of the emission of the light by each of all the light sources 2 at the same time.

The touch slider 5 is a component for operation of contact type. In FIG. 2, the touch slider 5 is disposed on a top of the touch slider unit 20. The touch slider 5 in the first embodiment has an approximately disk shape and is made of a transparent plastic material, for example.

The touch slider 5 includes a contact part 5a to be in contact with a user and an annular light-transmitting part 5b disposed to surround a circumference of the contact part 5a.

The user brings a finger 4 into contact with a surface of the contact part 5a and slides the finger 4 in a contact state, thereby operating the touch slider 5 (e.g., setting a cooking time). Both the contact part 5a and the light-transmitting part 5b of the touch slider 5 are integrally made of a transparent material.

In the first embodiment, the contact part 5a is plated with silver so that no light is allowed to pass through the contact part 5a. On the other hand, the light-transmitting part 5b having an annular shape is not plated so that the light is allowed to pass through the light-transmitting part 5b.

The holder 8 is a component which holds and fixes the touch slider 5. In a center of the holder 8, a circular through-hole having a radius slightly larger than an outer circumference of the touch slider 5 is provided. When the touch slider 5 and the holder 8 are fitted to each other with the touch slider 5 disposed in the through-hole, the touch slider 5 is held and fixed by the holder 8. When the holder 8 is fixed to a housing etc. of the microwave oven 21, the touch slider 5 is fixed at a predetermined position in the microwave oven 21 (on the front surface of the microwave oven 21 in the first embodiment).

The electrode sheet 7 is disposed between the touch slider 5 held by the holder 8 and the controller 1. The electrode sheet 7 is a sheet including electrodes etc. for detecting the contact of the finger 4 with the touch slider 5.

Figure 3:
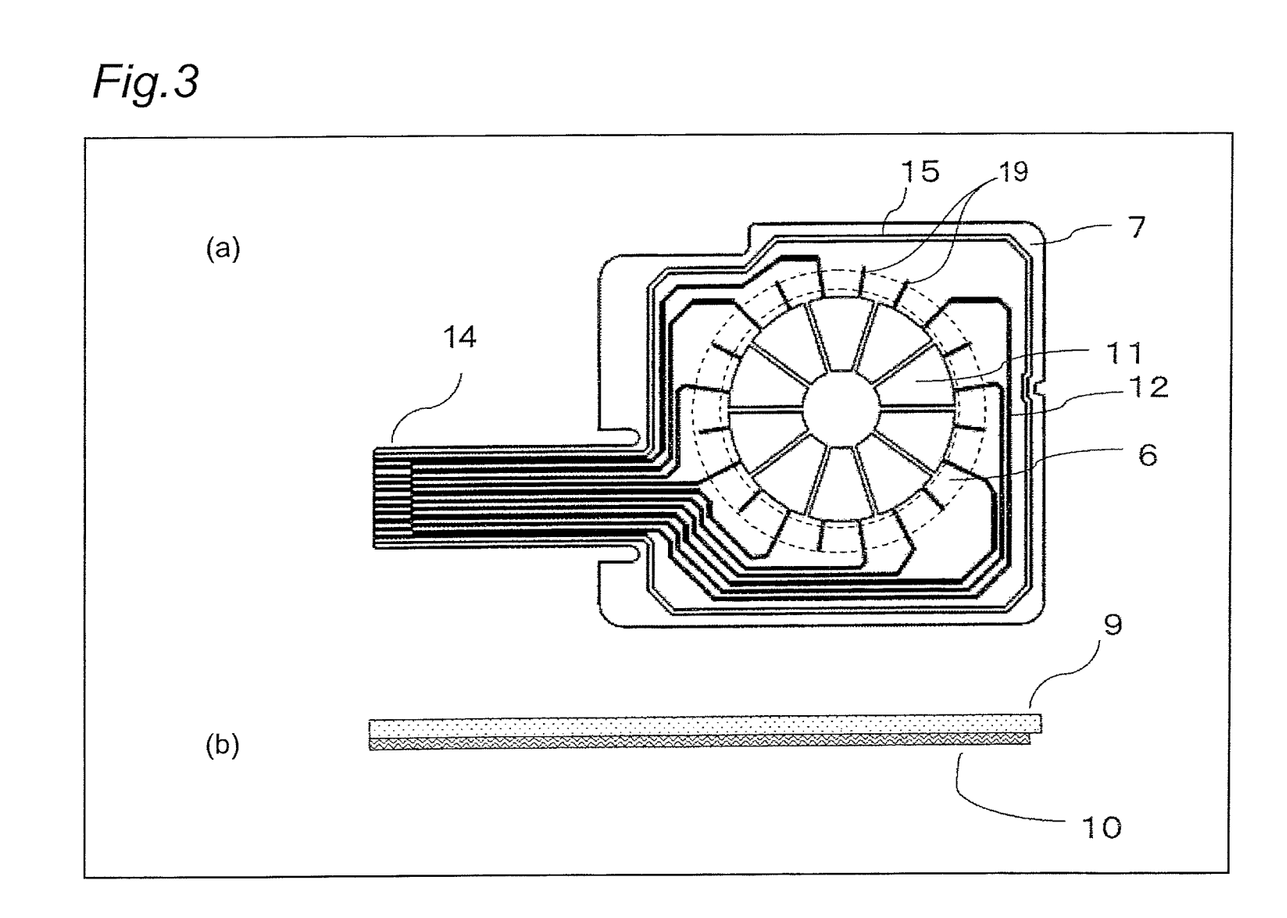
FIG. 3(a) is a top view of an electrode sheet of the touch slider unit in the first embodiment and FIG. 3(b) is a cross-sectional view of a conductive paint and a plastic film in the first embodiment.

FIGS. 3(a) and 3(b) depict details of the electrode sheet 7. As depicted in FIG. 3(a), electrodes 11 and electrode wirings 12 extended from the electrodes 11 are disposed on a surface of the electrode sheet 7. In the first embodiment, the ten electrodes 11 are arranged in an annular shape at regular intervals, and one of the electrode wirings 12 is extended from each of the electrodes 11. As depicted in FIG. 3(b), the electrodes 11 and the electrode wirings 12 can be printed on the electrode sheet 7 by printing a conductive paint 10 as an example of a conductive material, on a plastic film 9 as an example of a sheet.

A ground pattern 15 is disposed on an outer circumference portion of the electrode sheet 7, i.e., around the electrodes 11 and the electrode wirings 12. The ground pattern 15 acts as an electrode shield in the touch slider unit 20. The electrode wirings 12 and the ground pattern 15 are terminated at a cable termination 14 in a flat cable shape.

Projections 19 extended outward from the respective electrodes 11 are extended portions of the electrodes 11 for the purpose of increasing areas of the electrodes 11.

FIGS. 4(a) and 4(b) depict an assembled state of the touch slider unit 20 having the above-described components, respectively. FIG. 4(a) is a top view of the touch slider unit 20 and FIG. 4(b) is a cross-sectional view taken along B-B of FIG. 4(a).

As depicted in FIG. 4(b), the electrode sheet 7 is bonded to a lower surface of the touch slider 5 held by the holder 8. Under the touch slider 5 and the electrode sheet 7, the controller 1 is oppositely disposed at a distance. Not depicted in FIG. 4(b), the controller 1 and the holder 8 are fixed to the housing etc. of the microwave oven 21 (shown in FIG. 1).

As depicted in FIG. 4(a), the electrodes 11 of the electrode sheet 7 are bonded to a back surface of the contact part 5a of the touch slider 5. The electrode wirings 12 and the ground pattern 15 extended from the electrode sheet 7 are connected to a connector 16 of the controller 1 as depicted in FIG. 4(b). This connection enables the IC 3 of the controller 1 to detect a change in electrostatic capacity of the electrodes 11.

On the controller 1, the light sources 2 are disposed at positions facing the contact part 5a of the touch slider 5, i.e., inside an inner circumference of the light-transmitting part 5b of the touch slider 5.

Figure 5:
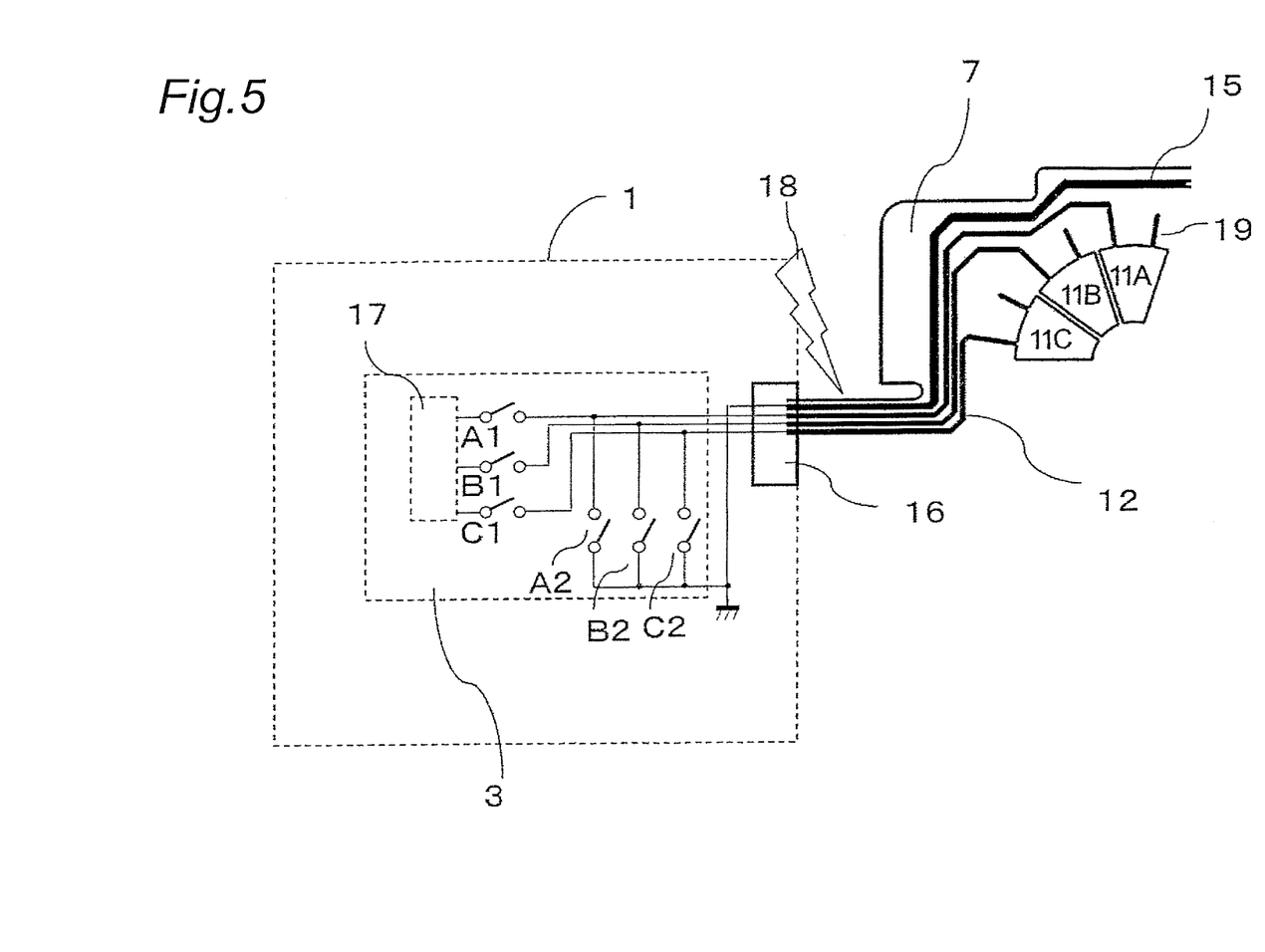
FIG. 5 is a diagram showing connection between an electrode sheet and a controller of the touch slider unit in the first embodiment.

The connection between the controller 1 and the electrode wirings 12 and the ground pattern 15 on the electrode sheet 7 will be described with reference to FIG. 5. As depicted in FIG. 5, the electrode wirings 12 from electrodes 11A, 11B, and 11C are connected via the connector 16 of the controller 1 to switches A1, B1, and C1, respectively, and switches A2, B2, and C2, respectively. The switches A1, B1, and C1 are connected to a touch detection circuit part 17. The switches A1, B1, and C1 can be switched on/off to switch the connection of the electrodes 11A, 11B, and 11C to the touch detection circuit part 17. On the other hand, the switches A2, B2, and C2 are connected to a ground line. The switches A2, B2, and C2 can be switched on/off to switch the connection of the electrodes 11A, 11B, and 11C to the ground line.

For example, when the switch B1 is turned on, the electrode 11B is connected to the touch detection circuit part 17, enabling the detection of the electrostatic capacity of the electrode 11B. When the switch B2 is turned on, the electrode 11B is connected to the ground line.

Figure 4:
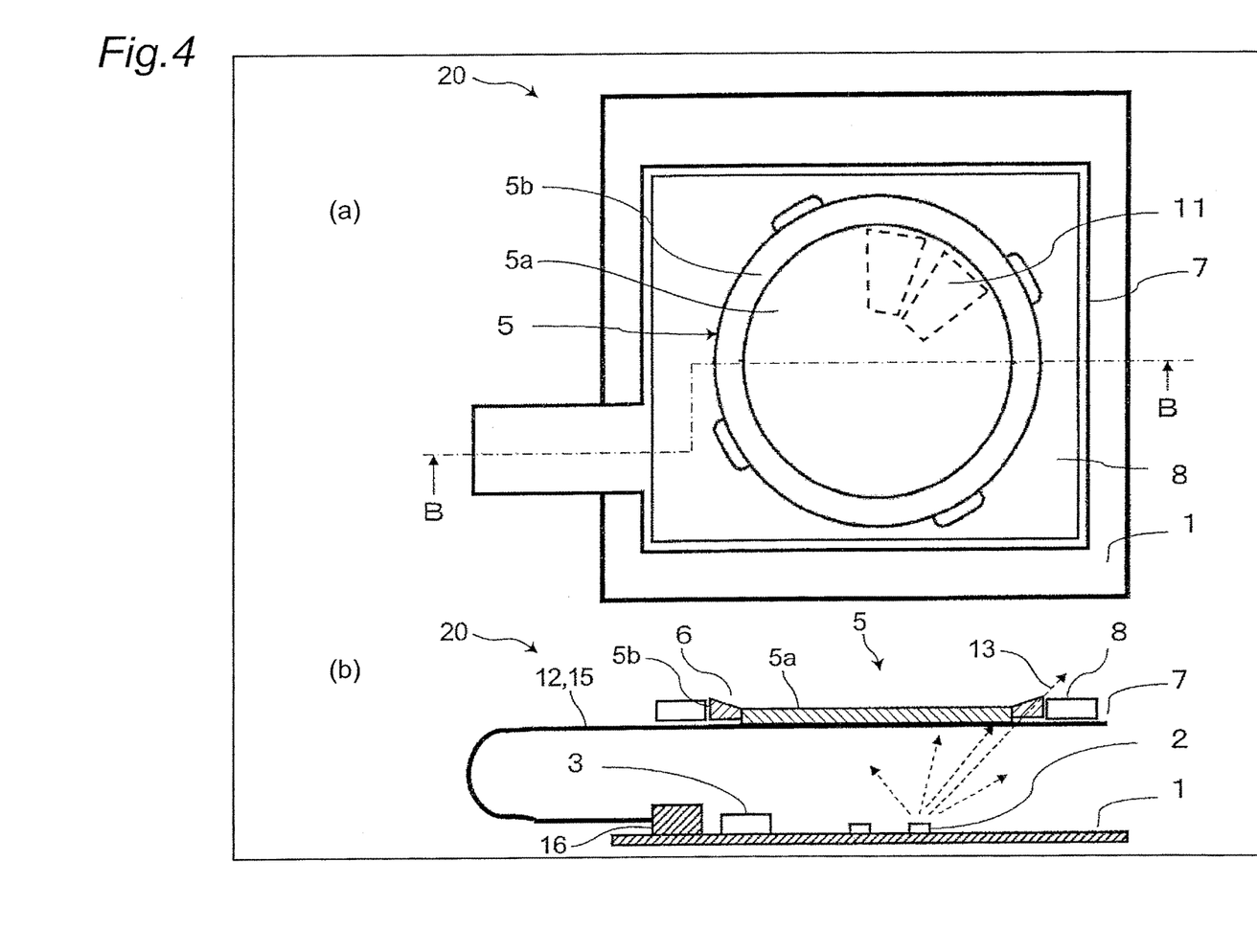
FIG. 4(a) is a top view of the touch slider unit in the first embodiment and FIG. 4(b) is a cross-sectional view taken along B-B of FIG. 4(a).

Hereinafter, an operation and action of the above-described touch slider unit 20 will be described with reference to FIGS. 2, 4, etc.

As depicted in FIG. 2, the finger 4 of the user comes into contact with the surface of the contact part 5a of the touch slider 5. This increases the electrostatic capacity of the electrodes 11 disposed on the back surface of the contact part 5a depicted in FIG. 4(a), i.e., the electrostatic capacity of the electrodes 11 with respect to an earth (ground). This change in the electrostatic capacity is detected by the IC 3 of the controller 1 depicted in FIG. 4(b).

Specifically, the IC 3 detects a change in a charge/discharge time for the electrostatic capacity of the electrodes 11. The controller 1 recognizes and detects the contact of the user with the touch slider 5 based on the change in the electrostatic capacity detected by the IC 3.

A method for operating the touch slider 5 has been described, and then a backlight using the light sources 2 disposed on the controller 1 will be described.

As depicted in FIG. 4(b), in the first embodiment, the light-transmitting part 5b is a transparent portion and formed around the contact part 5a of the touch slider 5. As a result, a light 13 emitted from the light sources 2 is radiated via the electrode sheet 7 and the light-transmitting part 5b to the outside (i.e., to the front side of the touch slider 5). In this way, the light 13 from the light sources 2 acts as the backlight of the touch slider unit 20. Therefore, the touch slider unit 20 can provide a favorable backlight characteristic, easily viewable even at night, and can improve its operability.

The controller 1 may turn on the light sources 2 to prompt the user to perform an operation procedure. This enables further improvement in the operability of the touch slider unit 20.

In the first embodiment, as depicted in FIG. 3(a), the electrodes 11 are formed by printing the conductive material on the transparent electrode sheet 7. On the electrode sheet 7, the electrode wirings 12 connected to the electrodes 11 and connected to the controller 1 are formed at positions (in a dotted-line portion) facing the light-transmitting part 5b of the touch slider 5. Since the electrodes 11 and the electrode wirings 12 are formed on the transparent electrode sheet 7 in this way, the light from the light sources can be allowed to reach the light-transmitting part 5b of the touch slider 5 via the transparent electrode sheet 7 from between the electrode wirings 12, even though the electrodes 11 and the electrode wirings 12 block the light. In this way, the favorable backlight characteristic of the light sources 2 can be maintained.

In the first embodiment, the thin electrode wirings 12 connected to the electrodes 11 are arranged at the positions facing the light-transmitting part 5b of the touch slider 5 at regular intervals. Such arrangement enables a visual recognition of the electrode wirings 12 from the front side of the light-transmitting part 5b, and a well-balanced favorable design effect can be provided since the electrode wirings 12 are arranged at regular intervals. The electrode wirings 12 can be easily designed so that its individual width is set to 0.3 mm or less. Such a setting can make the electrode wirings 12 less conspicuous.

In the first embodiment, the projections 19 projected from the electrodes 11 are provided. The areas of the electrodes 11 are increased by the projections 19, thereby increasing detection sensitivity when the finger 4 of the user touches the touch slider 5. The projections 19 finely divide illuminating portions of the light-transmitting part 5b, thereby providing a favorable design effect.

An operation and action of the ground pattern 15 surrounding the outer circumference of the electrode sheet 7 as depicted in FIG. 3(a) will be described with reference to FIG. 5.

The IC 3 (FIG. 1 etc.) in the first embodiment provides control such that when the switch B1 is turned on, the switch B2 is turned off while the switches A2 and C2 are turned on. With such control, one wiring of the wirings extended from the electrode 11B is connected to the touch detection circuit part 17 for measuring the electrostatic capacity, and two wirings sandwiching the one wiring on both sides are connected to the ground line. This can reduce influence of induced noise caused by a foreign electric wave noise 18 radiated to the electrode wirings 12, etc.

On the other hand, the IC 3 provides control such that when the switch A1 is turned on, the switch A2 is turned off while the switch B2 is turned on. Since the ground pattern 15 is disposed to surround the circumference around the electrodes 11 and the electrode wirings 12 in the first embodiment, the wiring of the electrode 11A connected to the touch detection circuit part 17 is sandwiched on both sides by ground lines (i.e, the wiring extended from the electrode 11B and the ground pattern 15). This can reduce the influence of the foreign electric wave noise 18.

Second Embodiment

Figure 6:
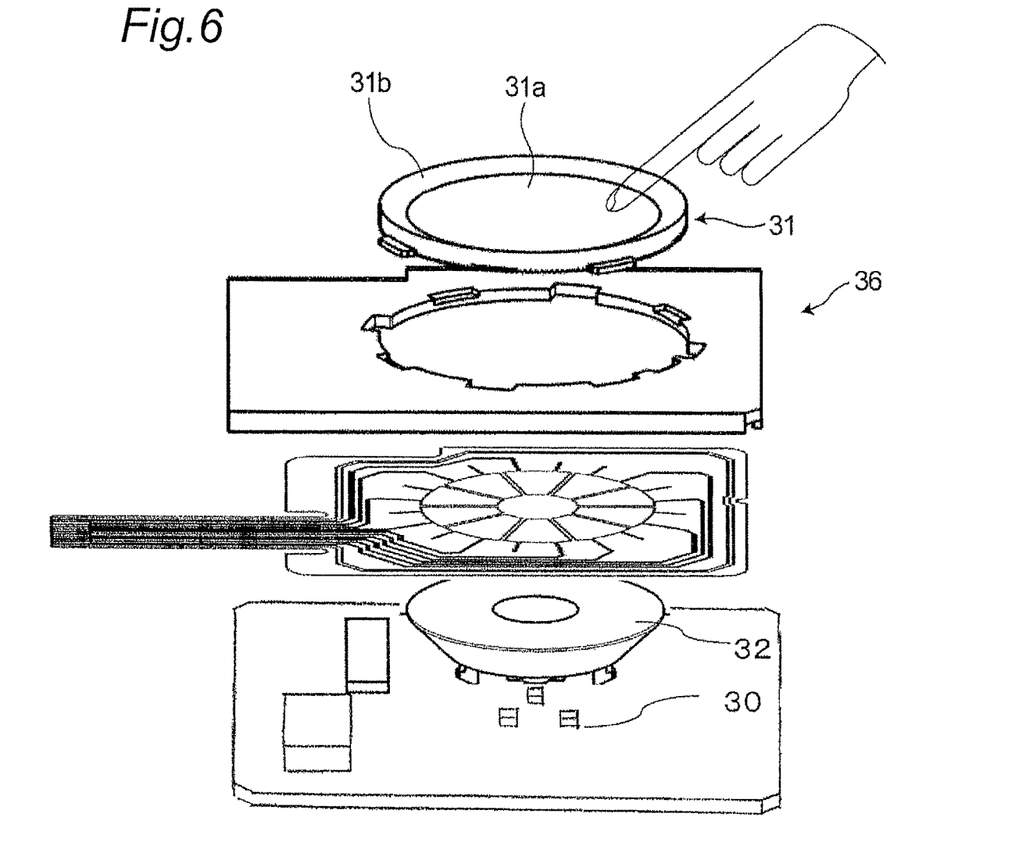
FIG. 6 is an exploded perspective view of a touch slider unit in a second embodiment of the present invention.
Figure 7:
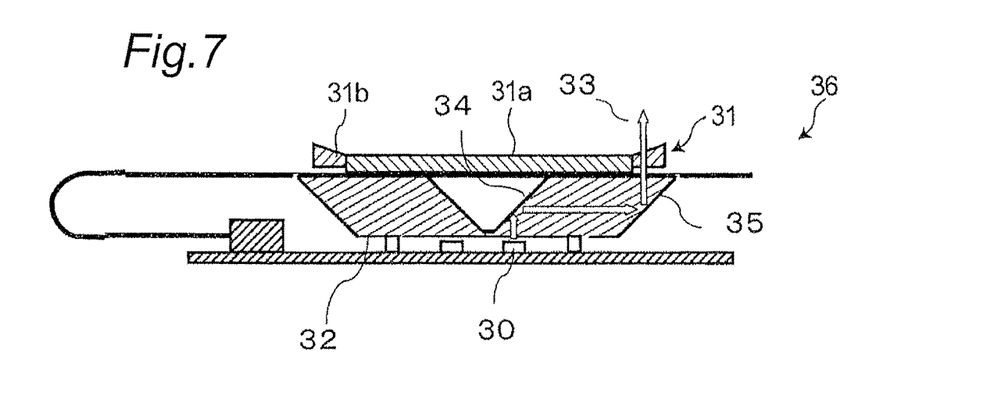
FIG. 7 is a cross-sectional view of the touch slider unit in the second embodiment.

FIG. 6 is a perspective view of a touch slider unit 36 of a second embodiment of the present invention, and FIG. 7 is a cross-sectional view of FIG. 6.

As depicted in FIGS. 6 and 7, in the second embodiment, a light guide plate 32 is provided between light sources 30 and a touch slider 31. A material of the light guide plate 32 is a transparent resin material such as acrylic or polycarbonate, for example. The light guide plate 32 includes a first surface 34 (central reflection surface 34) near a center of the light guide plate 32, and a second surface 35 (circumferential reflection surface 35) near a circumference of the light guide plate 32 at a position facing a light-transmitting part 31b of the touch slider 31.

The light sources 30 under the light guide plate 32 are disposed at positions facing a contact part 31a of the touch slider 31, i.e., inside an inner circumference of the light-transmitting part 31b of the touch slider 31.

Hereinafter, an operation and action of the above-described touch slider unit 36 including the light guide plate 32 will be described.

A light 33 from the light sources 30 perpendicularly enters the light guide plate 32 from a surface of the light guide plate 32 facing the light sources 30 (a bottom surface of the light guide plate 32 in FIG. 7). The light penetrating into the light guide plate 32 reaches the first surface 34 near the center of the light guide plate 32. The first surface 34 is tilted by 45 degrees relative to a traveling direction of the light, and the light 33 penetrating from a lower side in FIG. 7 is reflected by the first surface 34. The light 33 reflected by the first surface 34 has a traveling direction changed by 90 degrees and travels in a horizontal direction to reach the second surface 35.

The second surface 35 is tilted by 45 degrees relative to the light 33 reflected by the first surface 34 and traveling in the horizontal direction. Therefore, the light 33 reflected by the first surface 34 is reflected by the second surface 35 and has a traveling direction changed by 90 degrees to travel upward in FIG. 7. The light 33 finally passes through the light-transmitting part 31b of the touch slider 31 and is emitted from an upper surface of the light guide plate 32.

As described above, according to the second embodiment, the light guide plate 32 for guiding the light from the light sources 30 to the light-transmitting part 31b of the touch slider 31 is disposed between the light sources 30 and the touch slider 31. Since the light from the light sources 30 can be guided to the light-transmitting part 31b of the touch slider 31 because of the action of the light guide plate 32 disposed between the light sources 30 and the touch slider 31, the light from the light-transmitting part 31b can be emitted more uniformly while reducing its diffusion and attenuation. Therefore, a backlight characteristic can be achieved with favorable luminous efficiency and excellent uniformity.

According to the second embodiment, the light guide plate 32 has the first surface 34 to reflect the light which entered the light guide plate 32 from the light sources 30, and the second surface 35 to reflect the light reflected by the first surface 34 toward the light-transmitting part 31b. The light is reflected by the first and second surfaces 34 and 35 included in the light guide plate 32, thereby achieving the favorable backlight characteristic without providing a reflection tape etc. in the light guide plate 32 for reflecting the light. As a result, a number of parts of the light guide plate 32 can be reduced.

The light 33 is reflected by the second surface 35 when reaching the circumference inside the light guide plate 32, thereby passing through the light-transmitting part 31b of the touch slider 31 intensively. Therefore, even if light amount of the light sources 30 or a number of the light sources 30 is small, a sufficient amount of the light can be emitted uniformly from an entire surface of the light-transmitting part 31b. Therefore, the number of the light sources 30 can be reduced and power consumption can be cut down.

The acrylic and polycarbonate used as the transparent resin material of the light guide plate 32 in the second embodiment have optical refraction indexes of about 1.49 and 1.53, respectively, and critical angles of 42 degrees and 39 degrees, respectively. In this regard, the first surface 34 and the second surface 35 are tilted by 45 degrees relative to the respective traveling directions of the light 33 to be reflected, these degrees being greater than the respective critical angles. Therefore, the first surface 34 and the second surface 35 can totally reflect the light 33 and can prevent light leakage from the first surface 34 and the second surface 35. As a result, unlike a light guide plate having a reflection surface perpendicular to an optical path, the light guide plate 32 in the second embodiment can eliminate a need of affixing an aluminum foil tape, etc. for preventing the light leakage.

Third Embodiment

Figure 8:
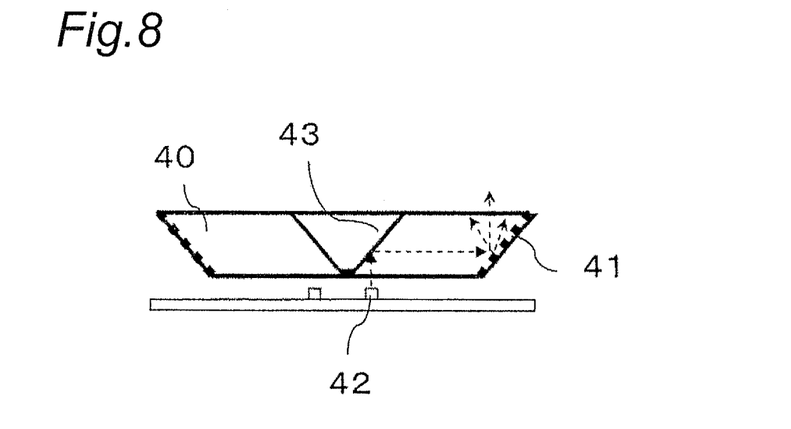
FIG. 8 is a cross-sectional view of a light guide plate of a touch slider unit in a third embodiment of the present invention.

FIG. 8 is a cross-sectional view of a light guide plate 40 of a touch slider unit in the third embodiment of the present invention.

In the third embodiment, as depicted in FIG. 8, a matte finish or a grain finish (surface texturing) in a concave-convex pattern is applied to a second surface 41 (circumferential reflection surface 41) in order to irregularly reflect the light.

Applying the matte finish or the grain finish to the second surface 41 can irregularly reflect the light. As a result, unevenness of the light due to possible scratches on a first surface 43 (central reflection surface 43) and the second surface 41 or due to a gate mark for a mold for resin molding can be made less conspicuous, and uniformity of the backlight can be improved.

Fourth Embodiment

Figure 9:
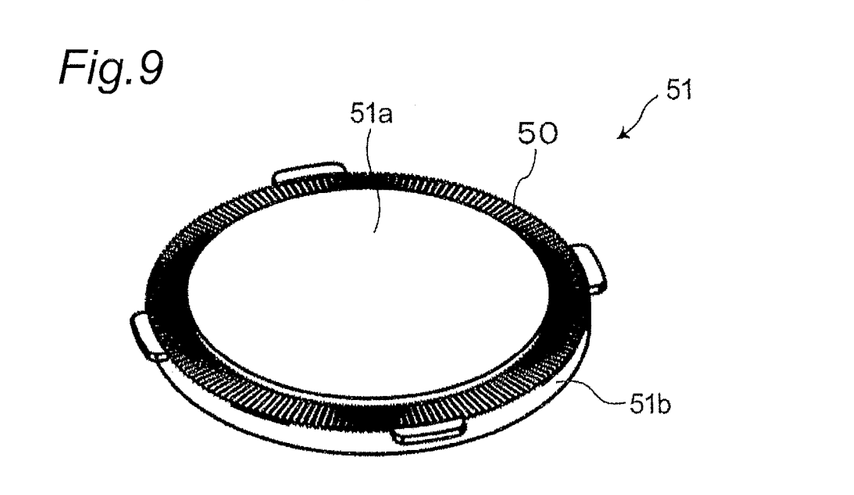
FIG. 9 is a perspective view of a back surface of a touch slider of a touch slider unit in a fourth embodiment of the present invention.

FIG. 9 is a perspective view of a back surface of a touch slider 51 of a touch slider unit in a fourth embodiment of the present invention.

In the fourth embodiment, as depicted in FIG. 9, a back surface 50 of a light-transmitting part 51b surrounding a contact part 51a of the touch slider 51 is a concave-convex surface to which a finish generally called "knurling" is applied.

Hereinafter, an operation and action of the above-described touch slider 51 will be described.

The back surface 50 of the light-transmitting part 51b of the touch slider 51 is the concave-convex surface, thereby scattering the light when passing through the back surface 50. As a result, a backlight is emitted more uniformly from an entire area of the back surface 50 of the light-transmitting part 51b. Furthermore, it is possible to make electrode wirings disposed on the back side of the light-transmitting part 51b less conspicuous.

In other words, the surface on the light-transmitting part 51b of the touch slider 51, which allows passage of the light, is the concave-convex surface in the fourth embodiment, thereby diffusing the light from the light-transmitting part 51b. As a result, unevenness of the light can be reduced and uniformity of the backlight can be improved. Furthermore, components which are disposed on the back side of the light-transmitting part 51b can be made less conspicuous, thereby providing a favorable design effect.

Although the back surface 50 of the light-transmitting part 51b of the touch slider 51 is the concave-convex surface in the fourth embodiment, a front surface of the touch slider 51 may be a concave-convex surface or a matte finish may be applied to the front surface, for example.

Fifth Embodiment

Figure 10:
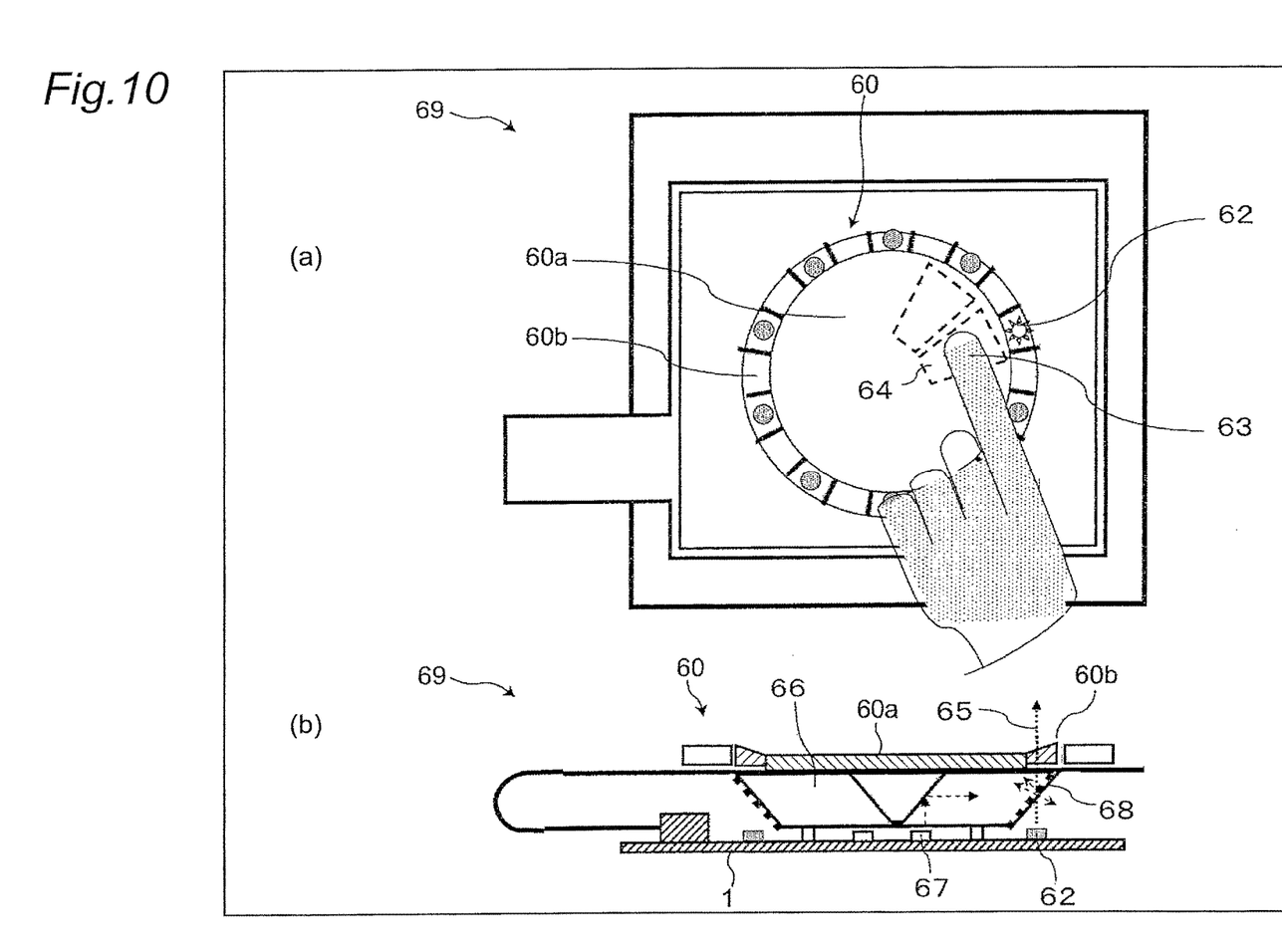
FIG. 10(a) is a top view of a touch slider unit in a fifth embodiment of the present invention and FIG. 10(b) is a cross-sectional view of FIG. 10(a).

FIG. 10(a) is a top view of a touch slider unit 69 of a fifth embodiment of the present invention, and FIG. 10(b) is a cross-sectional view of FIG. 10(a).

In the fifth embodiment, as depicted in FIGS. 10(a) and 10(b), a plurality of light sources 62 (ten light sources 62 in FIG. 10(a)) consisting of, for example, LEDs are arranged at positions facing a light-transmitting part 60b surrounding a contact part 60a of a touch slider 60.

Hereinafter, an operation and action of the above-described touch slider unit 69 will be described.

In the fifth embodiment, when a finger 63 of a user comes into contact with a contact part 60a of a touch slider 60, an electrode 64 near the contact position senses a presence of the finger 63 and a light source 62 closest to the contact position is turned on. When the light source 62 is turned on, as depicted in FIG. 10(b), a light 65 from the light source 62 enters a light guide plate 66 at a second surface 68 of the light guide plate 66. Since the second surface 68 of the light guide plate 66 is a concave-convex surface in the fifth embodiment, the light from the light source 62 reaching the second surface 68 will penetrate into the light guide plate 66 while being diffused by the second surface 68. The light 65 which entered the light guide plate 66 finally passes through the light-transmitting part 60b of the touch slider 60 and is then emitted to the outside.

As described above, the touch slider unit 69 provides control such that the light source 62 (LED) closest to the contact position coming into contact with the finger 63 is turned on, thereby enabling the user to visually recognize that the touch slider unit 69 is correctly detecting the contact of the finger 63. Moreover, the user watching the light from the light source 62 can slide the finger 63 on the touch slider 60 in accordance with a response speed of the touch slider unit 69. This enables the user to sensuously operate the touch slider unit 69.

In the fifth embodiment, a luminescent color (e.g., red) of the light sources 62 facing the light-transmitting part 60b of the touch slider 60 is different from a luminescent color (e.g., blue) of light sources 67 facing the contact part 60a of the touch slider 60. As a result, while the light from the light sources 67 uniformly glows at a whole circumference of the light-transmitting part 60b, only a portion thereof close to the contact position of the finger 63 can be lighted by the light source 62 in the different luminescent color. Mixing colors in this way can improve visibility of the backlight and provide a favorable design effect.

Thus, in the fifth embodiment, the light sources 67 are arranged to face the contact part 60a of the touch slider 60, and a plurality of the additional light sources 62 for emitting the light of a color different from the light sources 67 are arranged at positions facing the light-transmitting part 60b of the touch slider 60. When the controller 1 detects a contact of a user with the touch slider 60 in this arrangement, a light is emitted by the additional light source 62 closest to the contact portion of the touch slider 60 coming into contact with the user. The additional light source 62 is turned on, thereby enabling the user to intuitively understand that the contact with the touch slider 60 is recognized by the touch slider unit 69. This can further improve an operability of the touch slider unit 69.

Sixth Embodiment

Figure 11:
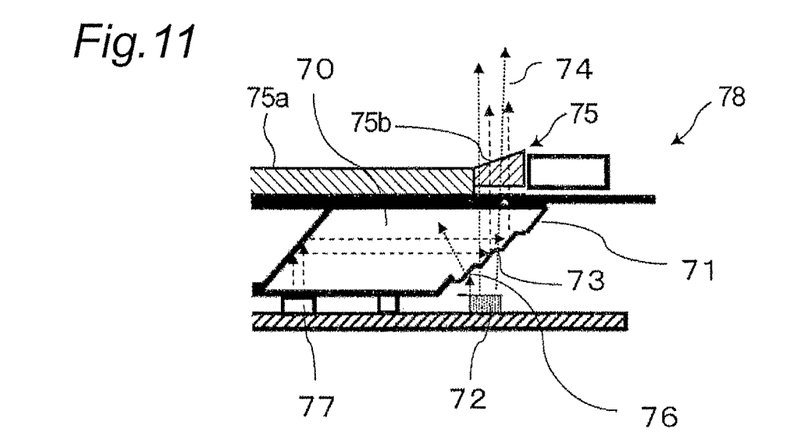
FIG. 11 is a cross-sectional view of a light guide plate of a touch slider unit in a sixth embodiment of the present invention.

FIG. 11 is a cross-sectional view of a light guide plate 70 of a touch slider unit 78 in a sixth embodiment of the present invention.

In the sixth embodiment, as depicted in FIG. 11, a second surface 71 (circumferential reflection surface 71) of the light guide plate 70 is provided with stair-like steps. Because of being provided with the steps, the second surface 71 includes planar portions 73 parallel to a light from a light source 77 and perpendicular to a light emitted by a light source 72, and tilted surfaces 76 tilted by 45 degrees relative to the lights from both the light source 77 and the light source 72.

Hereinafter, an operation and action of the above-described light guide plate 70 of the touch slider unit 78 will be described.

Of the light from the light source 72, a light reaching the planar portions 73 perpendicular to the light enters the light guide plate 70 from the planar portions 73 and will reach a light-transmitting part 75b of a touch slider 75. On the other hand, of the light from the light source 72, a light reaching the tilted surfaces 76 tilted by 45 degrees relative to the light mostly enters the light guide plate 70 having a refractive index larger than air with being refracted. The refracted light which has entered the light guide plate 70 hardly reaches the light-transmitting part 75b.

The steps are provided to the second surface 71 in this way, so the light of the light source 72 immediately below the second surface 71 can linearly be emitted from the light-transmitting part 75b of the touch slider 75. Therefore, attenuation of the light in the backlight can be prevented, and an original color of a bright light emitted by the light source 72 can be recognized from the light-transmitting part 75b.

The light from the light source 77 travels through the light guide plate 70 and is totally reflected by the tilted surfaces 76 of the second surface 71 to pass though the light-transmitting part 75b. As a result, the light from the light source 77 can be recognized brightly with no impairment of its original color, and therefore a favorable backlight characteristic can be maintained.

As described above, the touch slider units of the first to sixth embodiments have the favorable backlight characteristics and enable improvements in their operability. The touch slider units of the first to sixth embodiments can be applied to a microwave oven, leading to provide the microwave oven with the favorable backlight characteristics and the improved operability. Also, this leads to provide the microwave oven with a flat operation surface.

The touch slider units of the first to sixth embodiments have the favorable backlight characteristics and enable improvements in their operability, and therefore are applicable to an electrical product such as a microwave oven, for example.

Although the present invention has been fully described by way of preferred embodiments with reference to the accompanying drawings, it is to be noted here that various changes and modifications will be apparent to those skilled in the art. Therefore, unless such changes and modifications otherwise depart from the scope of the present invention as set forth in the appended claims, they should be construed as being included therein.

The contents of a specification, drawings and claims of a Japanese patent application No. 2012-126767 filed on Jun. 4, 2012 are herein expressly incorporated by reference in their entirety.

What is claimed is:

1. A touch slider unit comprising:
   a touch slider having a contact part configured to be in contact with a user and a light-transmitting part disposed to surround a circumference of the contact part and configured to provide backlighting for the contact part;
   an electrode disposed on a back surface of the contact part of the touch slider;
   a controller configured to detect a change in electrostatic capacity of the electrode to detect a contact of the user with the touch slider based on the detected change in the electrostatic capacity of the electrode; and
   a light source disposed on the back side of the touch slider,
   wherein the controller is formed into a plate shape and disposed to face the back surface of the touch slider,
   wherein the light source is disposed on the controller to face the contact part of the touch slider,
   wherein a plurality of additional light sources, each of which emits light of a color different from the light source, are disposed on the controller at positions facing the light-transmitting part of the touch slider, and
   wherein the controller is further configured to cause the light source facing the contact part to emit a light and, when the controller detects a contact of the user with the touch slider, to also cause the additional light source closest to the portion of the touch slider coming into contact with the user to emit a different colored light.

2. The touch slider unit of claim 1, wherein
   the electrode is formed by printing a conductive material on a transparent sheet, and wherein
   an electrode wiring connected to the electrode and connected to the controller is formed on the sheet at a position facing the light-transmitting part of the touch slider.

3. The touch slider unit of claim 2, wherein a ground pattern is formed on the sheet to surround a circumference around the electrode and the electrode wiring.

4. The touch slider unit of claim 1, wherein a light guide plate is provided between the light source and the touch slider to guide the light from the light source to the light-transmitting part of the touch slider.

5. The touch slider unit of claim 4, wherein the light guide plate has a first surface to reflect a light which entered the light guide plate from the light source, and a second surface to reflect a light reflected by the first surface toward the light-transmitting part.

6. The touch slider unit of claim 5, wherein a matte finish is applied to the second surface of the light guide plate.

7. The touch slider unit of claim 1, wherein a surface on the light-transmitting part of the touch slider allowing passage of light is a concave-convex surface.

8. The touch slider unit of claim 1, wherein a matte finish is applied to a surface on the light-transmitting part of the touch slider allowing passage of light.

9. A microwave oven comprising: the touch slider unit of claim 1.

* * * * *